United States Patent
Kashiwazaki et al.

[11] Patent Number: 6,119,336
[45] Date of Patent: *Sep. 19, 2000

[54] ELECTRONIC COMPONENT SUCKING METHOD

[75] Inventors: Takao Kashiwazaki, Yamanashi-ken; Tokio Shirakawa, Kofu; Koichi Yasunaga, Yamanashi-ken; Hironori Konno, Kofu, all of Japan

[73] Assignee: Matsushita Electric Industrial Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/936,915

[22] Filed: Sep. 25, 1997

Related U.S. Application Data

[63] Continuation of application No. 08/936,915, Sep. 25, 1997.

[30]     Foreign Application Priority Data

Sep. 26, 1996  [JP]  Japan .................................... 8-254032

[51] Int. Cl.[7] .................................................. H05K 3/30
[52] U.S. Cl. ................................ 29/832; 29/740; 29/743; 29/759
[58] Field of Search ............................. 29/740, 741, 742, 29/743, 759, 832, 834, 836

[56] References Cited

U.S. PATENT DOCUMENTS

| | | | |
|---|---|---|---|
| 5,060,366 | 10/1991 | Asai et al. | 29/743 X |
| 5,265,330 | 11/1993 | Sakaguchi | 29/740 X |
| 5,289,625 | 3/1994 | Umetsu et al. | 29/714 X |
| 5,339,248 | 8/1994 | Fujiwara et al. | 29/743 X |
| 5,491,888 | 2/1996 | Sakurai et al. | 29/759 X |

FOREIGN PATENT DOCUMENTS

| | | | |
|---|---|---|---|
| 000601603 | 6/1994 | European Pat. Off. | 29/739 |
| 0 727 933 A1 | 8/1996 | European Pat. Off. | |
| 404177898 | 6/1992 | Japan | 29/739 |

*Primary Examiner*—Lee Young
*Assistant Examiner*—Rick Kiltae Chang
*Attorney, Agent, or Firm*—Parkhurst & Wendel, L.L.P

[57] ABSTRACT

This invention provides an electronic component sucking method in which the movement of a component supply table (15) can be increased without increasing tact time, thereby improving the mounting efficiency of electronic components (2, 4). According to this invention, the movement disabled period of the component supply table (15) is set on the basis of the height of an electronic component (2, 4) in order that the interlock time for a low electronic component (4) can be set to be shorter and the movement enabled period of the component supply table (15) can be set to be longer. Therefore, a low electronic component (4) can have a shorter tact time, thereby improving the overall mounting efficiency of electronic components.

3 Claims, 5 Drawing Sheets

ELECTRONIC COMPONENT SUCKING METHOD

This is a Continuation of application Ser. No. 08/936,915 filed Sep. 25, 1997.

FIELD OF THE INVENTION

The present invention relates to an electronic component sucking method for sucking an electronic component for transfer when mounting the component on a circuit substrate using an electronic component mounting apparatus.

BACKGROUND OF THE INVENTION

FIGS. 4 to 6 describe a conventional electronic component sucking method used in, for example, an electronic component mounting apparatus that mounts an electronic component on a circuit substrate to suck the electronic component, during its mounting, to transfer it to its mounting position.

FIG. 4 shows a partial configuration of a general electronic component mounting apparatus for implementing the conventional electronic component sucking method. In FIG. 4, 11 is a rotating table that can be intermittently rotated wherein a plurality of rods 12 are equidistantly spaced on the periphery of the table so as to be elevated and lowered. A suction nozzle 13 that sucks an electronic component is disposed at the tip of each rod 12. Mechanical valves 14 for switching a vacuum circuit for each suction nozzle 13 on and off are disposed on the rotating table 11. In addition, a component supply table 15 is provided on which a plurality of component supply means 16 are disposed and which supplies a desired one of the electronic components in the component supply means to a component sucking position at which the component is sucked by the suction nozzle 13. A circuit substrate 17 on which electronic components are to be mounted is fixed onto an XY table 18, which is configured to allow a specified mounting position of the electronic component on the circuit substrate 17, which corresponds to the component sucking position by the suction nozzle 13.

As shown in FIG. 5, a cam for driving the suction nozzle 13 so as to elevate and lower it is rotated once (360°) during a single component-sucking operation time (this is referred to as a "tact time"). During the former half of the operation, the rotating table 11 is intermittently rotated through a specified angle (this is referred to as an "index"), while the component supply table 15 is moved to place the desired electronic component at the component sucking position. During the latter half of the operation, the suction nozzle 13 is elevated and lowered to suck the electronic component.

The index period is set at a value of a period of time during which the suction nozzle 13 is in its elevation limit position or of an appropriate allowable period of time before or after the period of time of said elevation limit. In addition, a component supply table 15 movement enabled period is set based on the elevating and lowering operations of the suction nozzle 13. That is, the end point of the component supply table 15 movement enabled period is set at a point of time at which the component supply table 15 can be rotated without obstruction by the suction nozzle 13 after the nozzle 13 has been lowered until its tip contacts an electronic component 19 as shown in FIG. 6A. The starting point of the component supply table 15 movement enabled period is set at a point of time at which the suction nozzle 13 has been elevated up to the maximum height (h) of the electronic component 19 as shown in FIG. 6B.

Since, however, the conventional electronic component sucking method sets the component supply table 15 movement enabled period so as to have a specified interlock period based on the sucking condition of the electronic component 19 shown in FIGS. 6A and 6B, as shown in FIG. 5, the electronic component 19 is unlikely to interfere with a component housing table 20 however large an electronic component 19 is sucked, but the component supply table 15 movement enabled period is set relatively shorter.

As a result, the component supply table 15 must be moved over a long distance for positioning, and the tact time must be set at a large value if the time required by the table to move does not fall within the component supply table 15 movement enabled period. This reduces the working efficiency in the overall electronic component mounting process.

DISCLOSURE OF THE INVENTION

This invention solves the conventional problem by providing an electronic component sucking method that can increase the movement of a component supply table without increasing tact time in order to improve the mounting efficiency of electronic components.

To achieve this object, this invention provides an electronic component sucking method for mounting an electronic component on a circuit substrate positioned with two-dimensional coordinates in the directions of X and Y axes by way of sucking the electronic component and transfering it to its mounting position on the circuit substrate by means of a component holder capable of moving in the direction of a Z axis that is perpendicular to the two-dimensional coordinates in the X and Y axes, wherein each time an electronic component is to be sucked at its suction position in an electronic component supply section, a component holder sucks the electronic component by way of varying the movement start timing of the component supply table in the electronic component supply section on the basis of a position to which said component holder has been elevated so as to correspond to the height of the electronic component.

Due to this configuration, this invention is characterized in that the component supply table movement enabled period can be increased by setting the movement disabled period of the component supply table on the basis of the height of the electronic component.

Thus, the movement of the component supply table can be increased without increasing the tact time, thereby improving the mounting efficiency of electronic components.

DESCRIPTION OF THE EMBODIMENT

Figure 1:
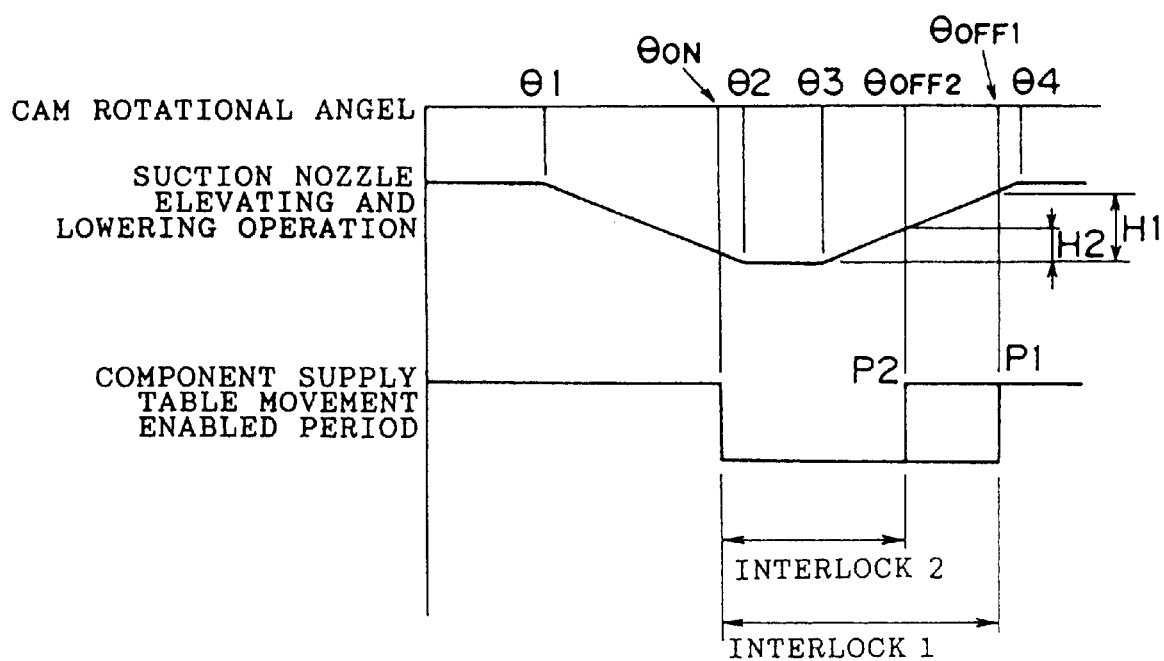
FIG. 1 is an operational timing chart for an electronic component sucking method according to an embodiment of this invention.

An electronic component sucking method showing an embodiment of this invention which is adapted to an electronic component mounting apparatus is specifically described with reference to FIGS. 1 to 3. The overall configuration of the electronic component mounting apparatus corresponding to this electronic component sucking method is similar to the conventional configuration shown and described in FIG. 4, so its detailed description is omitted.

Figure 2:
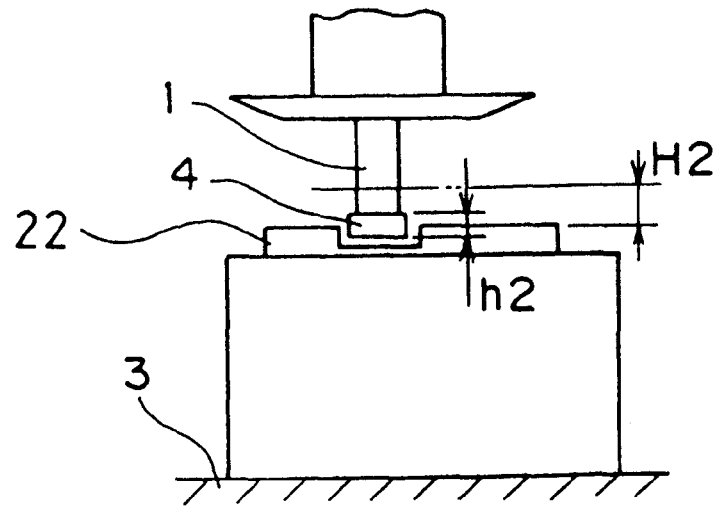
FIG. 2 describes a condition in which an electronic component is sucked according to the embodiment.
Figure 3:
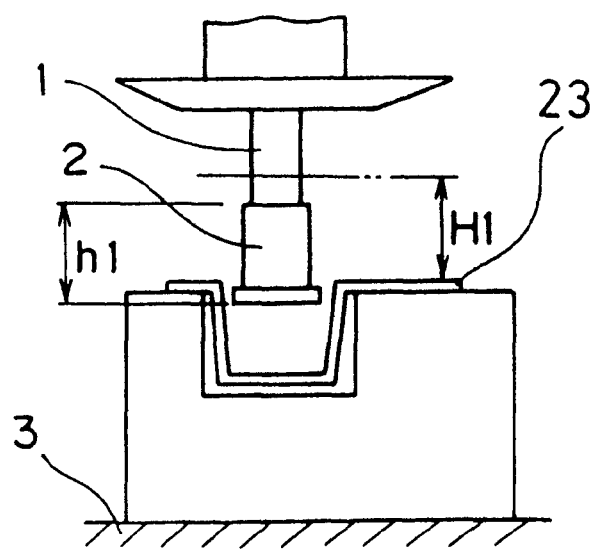
FIG. 3 describes another condition in which an electronic component is sucked according to the embodiment.

FIGS. 2 and 3 show a condition in which an electronic component is sucked, indicating the interference relationship during the sucking of the electronic component. In FIG. 3, 1 is a suction nozzle and 2 is an electronic component that is to be unloaded from a housing tape 23.

Figure 4:
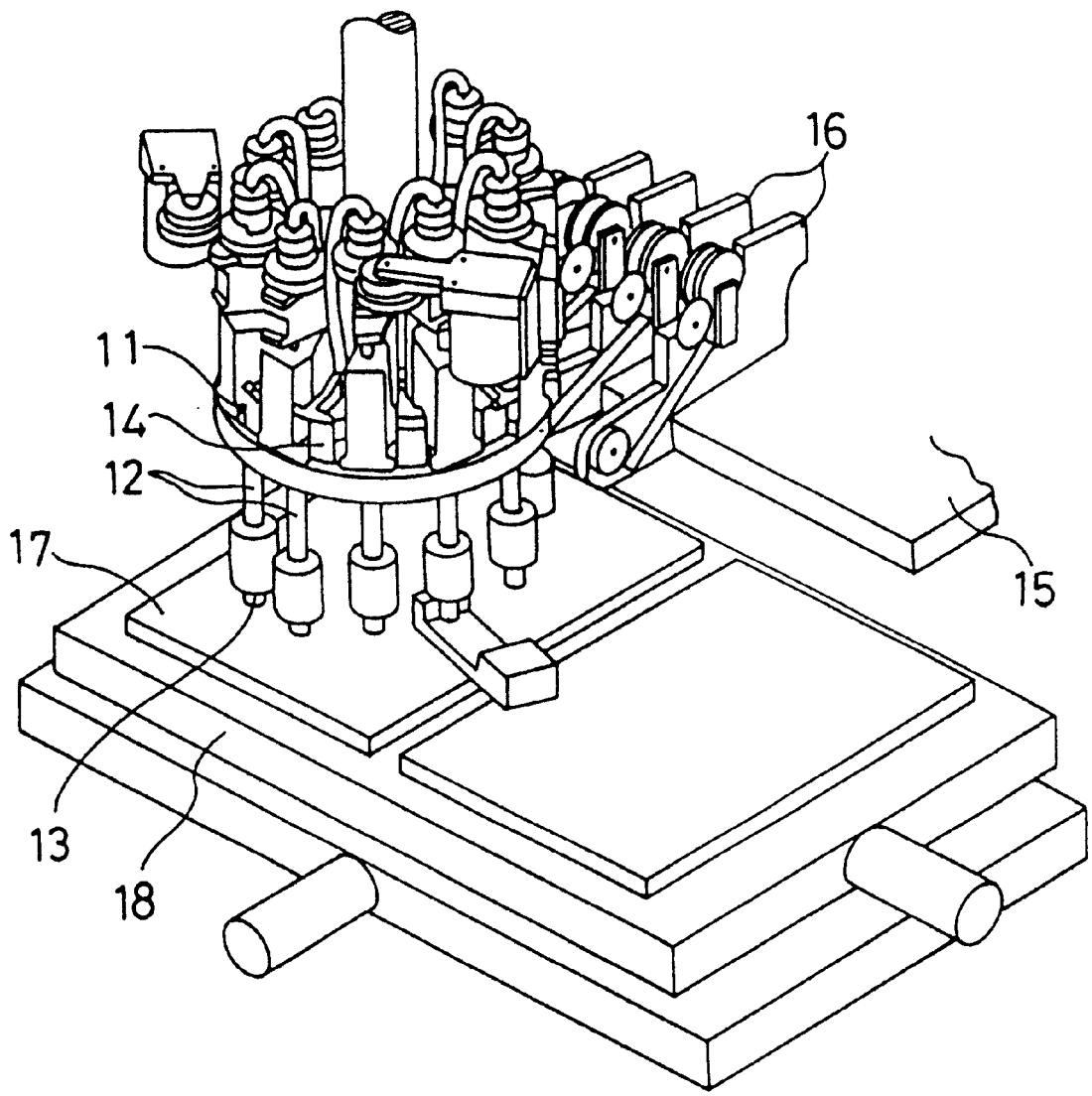
FIG. 4 is a perspective view showing a partial configuration of a general electronic component mounting apparatus.
Figure 5:
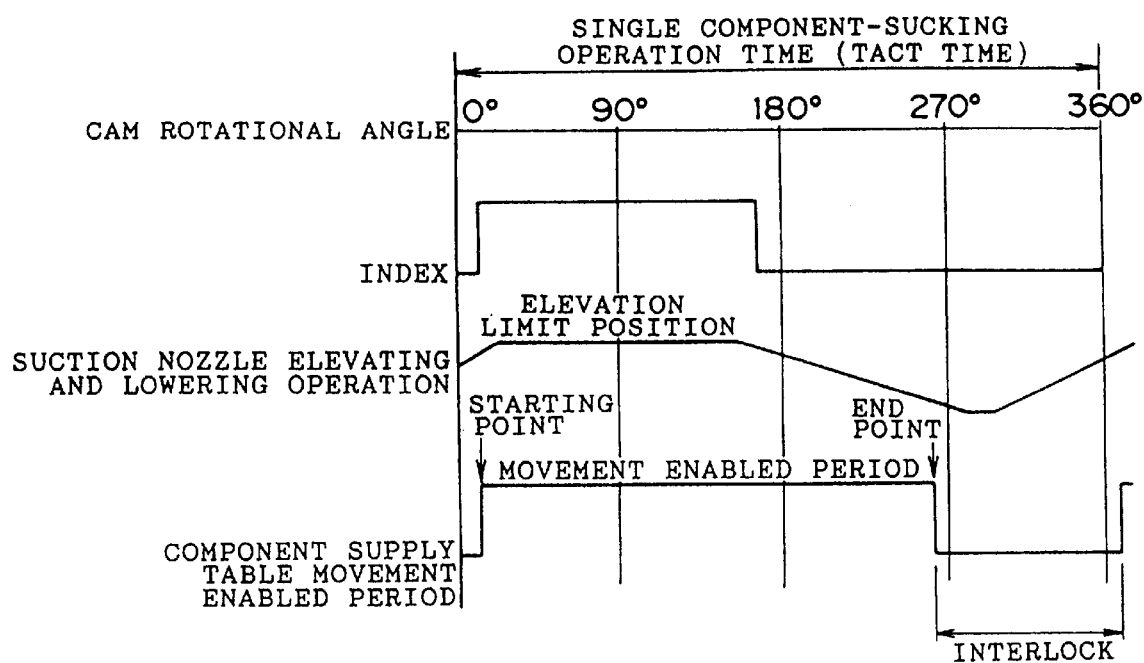
FIG. 5 is an operational timing chart for a conventional electronic component sucking method.
Figure 6A:
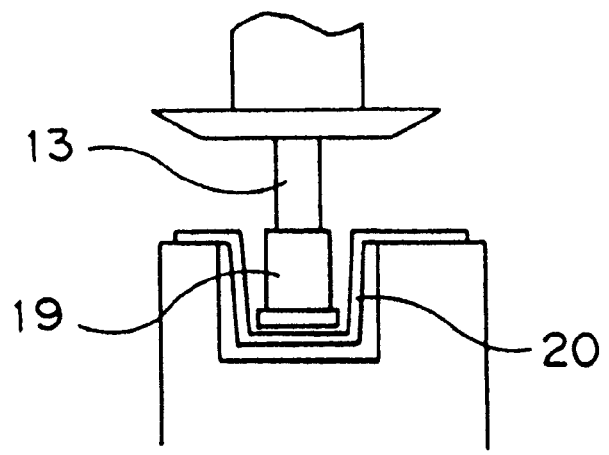
FIGS. 6A and 6B describe a condition in which an electronic component is sucked according to an conventional example.
Figure 6B:
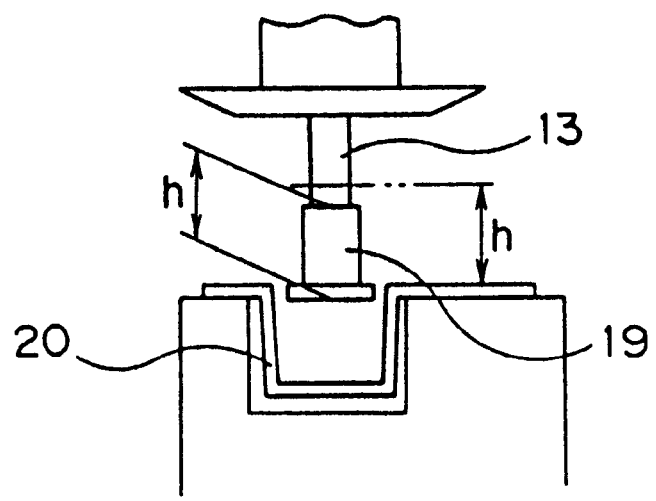

In the same manner as shown in FIG. 4, a suction nozzle 1 is provided at the tip of each of a plurality of rods equidistantly spaced on the periphery of a rotating table that can be intermittently rotated in order to suck an electronic component 2. A mechanical valve for switching a vacuum circuit on and off is disposed for the suction nozzle 1 so that the nozzle can suck and release the electronic component 2. A plurality of component supply means are located on a component supply table 3 and supply a desired one of the electronic components in the component supply means to the suction nozzle 1. The suction nozzle 1 is lowered to suck the electronic component 2, which has been transferred to its suction position. After lowering, the suction nozzle 1 sucks the electronic component 2 and is then elevated up to a position at which it does not interfere with the component housing tape 23.

Some electronic components 2, for example, aluminum electrolytic capacitors have a relatively large height h1. Thus, the suction nozzle 1 is elevated from the component housing tape 23 up to a height H1 that is larger than the height of the electronic component h1, before the component supply table 3 is enabled to move.

In FIG. 2, 4 is similarly an electronic component to be unloaded from a component housing tape 22. The electronic component 4, for example, a square chip resistor, has a relatively small height h2. The suction nozzle 1 is elevated from the component housing tape 22 up to a height H2 that is larger than the height of the electronic component h2, before the component supply table 3 is enabled to move.

This operation is described with reference to the timing chart shown in FIG. 1.

A cam rotational angle $\theta_{ON}$ is both the end point of the component supply table 3 movement enabled period and the starting point of interlock. If the electronic component 2 is relatively large, the suction nozzle 1 must be elevated from the component housing tape 23 up to the height H1 that is larger than the height of the electronic component h1, so the cam must be rotated through a rotational angle $\theta_{OFF1}$. In this case, the end point of the interlock is P1.

For the relatively small electronic component 4, since the component supply table 3 can be moved when the suction nozzle 1 has been elevated from the component housing tape 22 up to the height H2 that is larger than the height of the electronic component h2, the cam may be rotated through a rotational angle $\theta_{OFF2}$. In this case, the end point of the interlock is P2.

As described above, as the suction nozzle 1 is elevated and lowered, the component supply table 3 movement enabled period can have a plurality of starting points P1, P2, . . . depending on the elevated position of the suction nozzle 1. Thus, when a low electronic component is sucked, the component supply table 3 movement enabled period is increased by the time equal to the interlock 1 minus the interlock 2. Therefore, a low electronic component can have a shorter tact time, thereby improving the overall mounting efficiency of electronic components.

What is claimed is:

1. An electronic component suction method for an electronic component mounting apparatus comprising an intermittently rotatable table, said intermittently rotatable table is provided with a plurality of rods disposed with a staying suction nozzle at a tip of each rod so as to be elevated and lowered, and a component supply table provided with a plurality of component supply means adjacent to said intermittently rotatable table, the method comprising:

rotating said intermittently rotatable table to a first position for a staying suction nozzle to supply suction to an electronic component;

transferring said component supply table to the first position where said staying suction nozzle can apply suction to an electronic component stored in said component supply means of said component supply table;

lowering said staying suction nozzle to apply suction to the electronic component stored in said component supply means; and elevating said staying suction nozzle subsequent to applying suction to the electronic component up to an elevated position that avoids interference between the electronic component and said component supply means; wherein movement start timing of said component supply table is variable in correspondence to a height of the electronic component held by said staying suction nozzle so that said component supply table is moved after staying suction nozzle having applied suction to the electronic component is elevated up to a high position for an electronic component having a large height, and to a low position for an electronic component having a small height.

2. An electronic component suction method for an electronic component mounting apparatus comprising an intermittently rotatable table, said intermittently rotatable table is provided with a plurality of rods disposed with a staying suction nozzle at a tip of each rod so as to be elevated and lowered, and a component supply table provided with a plurality of component supply means adjacent to said intermittently rotatable table, the method comprising:

rotating said intermittently rotatable table to a first position for the staying suction nozzle to apply suction to an electronic component;

transferring said component supply table to the first position where said staying suction nozzle can apply suction to an electronic component stored in said component supply means of said component supply table;

lowering said staying suction nozzle to apply suction to the electronic component stored in a recess of said component supply means; and elevating said staying suction nozzle subsequent to applying suction to the electronic component up to an elevated position that avoids interference between the electronic component and said recess of said component supply means; wherein movement start timing of said component supply table is variable in correspondence to a height of the electronic component held by said staying suction nozzle so that said component supply table is moved after staying suction nozzle having applied suction to the electronic component is elevated up to a high position for an electronic component having a large height, and to a low position for an electronic component having a small height.

3. An electronic component suction method for an electronic component mounting apparatus comprising an intermittently rotatable table provided with a plurality of rods disposed with an elevation controllable suction nozzle at a tip of each rod and a component supply table provide with a plurality of component supply means adjacent to said table, the method comprising:

rotating said table to a first position for a nozzle to apply suction to an electronic component;

transferring said component supply table to the first position where said nozzle can apply suction to an electronic component stored in said component supply means of said component supply table;

lowering said nozzle to apply suction to the electronic component stored in said component supply means; and elevating said nozzle subsequent to applying suction to the electronic component up to an elevated position that avoids interference between the electronic component and said component supply means;

wherein a movement disable period of said component supply table is set on the basis of the height of said electronic component such that the movement disable period for an electronic component with a low height is shorter than the movement disable period for an electronic component with a high height.

* * * * *